(12) United States Patent
Hirasawa et al.

(10) Patent No.: US 7,123,256 B2
(45) Date of Patent: Oct. 17, 2006

(54) DRAWING REGISTRATION SYSTEM AND DRAWING REGISTRATION METHOD

(75) Inventors: Ken Hirasawa, Tokyo (JP); Mitsugu Hirano, Tokyo (JP); Yuuichi Ogasawara, Tokyo (JP)

(73) Assignee: Honda Motor Co. Ltd., Tokyo (JP)

( * ) Notice: Subject to any disclaimer, the term of this patent is extended or adjusted under 35 U.S.C. 154(b) by 0 days.

(21) Appl. No.: 10/715,140

(22) Filed: Nov. 18, 2003

(65) Prior Publication Data

US 2004/0199868 A1    Oct. 7, 2004

(30) Foreign Application Priority Data

Nov. 29, 2002   (JP)   ............... 2002-348586

(51) Int. Cl.
G06T 15/00    (2006.01)
G06T 17/00    (2006.01)
G06T 15/10    (2006.01)
G09G 5/00     (2006.01)
G00F 19/00    (2006.01)

(52) U.S. Cl. ............. 345/419; 345/420; 345/421; 345/427; 345/619; 700/95; 700/97; 700/98

(58) Field of Classification Search ............... 345/619, 345/441, 442, 443; 382/203
See application file for complete search history.

(56) References Cited

U.S. PATENT DOCUMENTS 5,701,403 A * 12/1997 Watanabe et al. ........... 345/419
5,809,170 A *  9/1998 Saito ........................... 382/203
5,818,458 A * 10/1998 Saito ........................... 345/441
5,991,702 A * 11/1999 Saito ........................... 702/155
6,018,352 A *  1/2000 Saito ........................... 345/678
6,301,391 B1* 10/2001 Nomizu ....................... 382/236
2002/0087434 A1* 7/2002 Katano et al. ................ 705/27
2003/0088551 A1* 5/2003 Tong ............................. 707/3

FOREIGN PATENT DOCUMENTS

| JP | 05-307582   | 11/1993 |
| JP | 08-147352   |  6/1996 |
| JP | 10-326308   | 12/1998 |
| JP | 2000-331058 | 11/2000 |
| JP | 2000-348077 | 12/2000 |
| JP | 2002-117100 |  4/2002 |
| JP | 2002-278975 |  9/2002 |

* cited by examiner

*Primary Examiner*—Ulka Chauhan
*Assistant Examiner*—Eric Woods
(74) *Attorney, Agent, or Firm*—Arent Fox PLLC

(57) ABSTRACT

This invention makes it possible to quickly and easily register a drawing and related information.

A parent drawing that is created using a drawing creation system (CATIA), accompanying information, and the object part information are given ID information containing the same number and correlated with each other and registered in the conversion server. The ID information given to the accompanying information is the number of the parent drawing to which an ID code indicating that the information is accompanying information is added, and the ID information given to the object part information is the number given to the parent drawing to which an ID code indicating that the information is object part information.

1 Claim, 2 Drawing Sheets

DRAWING REGISTRATION SYSTEM AND DRAWING REGISTRATION METHOD

DETAILED DESCRIPTION OF THE INVENTION

1. Field of the Invention

This invention relates to a drawing-registration system and drawing-registration method, and particularly to a drawing-registration system and drawing-registration method for registering drawing data for a part and the information accompanying that drawing.

2. Description of the Related Art

Conventionally, registering drawings was performed using a procedure as shown in FIG. 2. First, the drawing data for a drawing (parent drawing) created using CATIA (drawing creation system) 1 is printed on paper 2. Next, the drawing printed on paper 2 is photographed using a camera and microfilm (M/F) 3 is created. In the case of entering the same drawing (parent drawing) into an online-drawing-search database system 21, first the microfilm 3 is read using a M/F scanner 11 to convert to drawing data, and then it is stored on an electronic medium (for example, an MO (magneto-optics) disc) 12. Finally, the data format of the drawing data stored on the electronic medium 12 is converted is converted to the data format that is used by the online-drawing-search database 21, and then the drawing data, whose data format has been converted, is paired up with the accompanying information for the drawing data and edited, and then registered in the online-drawing-search database 21.

Also, there is a system in which by creating a set-up procedure based on attribute information such as the shape for 3-dimensional CAD data, name, type and the like, and by supporting process creation, it is possible for someone who is not a civil engineer having a lot of skill and experience, to create a process chart and to design an optimum installation procedure without using a lot of time and effort, and such that the workers who will actually perform the installation work can sufficiently understand all of the installation examination contents created by the creator of the process chart (for example refer to patent document 1).

[Patent Document 1]
Japanese patent 2002–117100 (drawing 1)

[Problems to be Solved by the Invention]

Here, since needless work of specially printing the drawing data created by CATIA 1 on paper 2, creating a microfilm 3, reading the microfilm 3 using a M/F scanner 11 to convert the drawing to drawing data, and then by way of a MO disc 12 entering accompanying information by hand operation and entering the drawing data into an online-drawing-search database 21 was performed, there was a problem of poor work efficiency. Also, in the stage of creating the microfilm 3, there was the problem that there were cases in which correction was necessary due to damage to the microfilm 3. Furthermore, since human labor was involved, there was a problem of high cost.

Also, in the process-plan-management-support method of patent document 1, there was a problem in that it was not possible to efficiently register a drawing with left-right symmetry.

This invention takes the problems described above into consideration and makes it possible to perform the work of registering drawing data efficiently and cheaply.

[Means for Solving the Problems]

The drawing-registration system of claim 1 comprises: a drawing-creation means of creating a drawing for a specified part; an accompanying-information-input means of inputting accompanying information that is related to the drawing; a symmetrical-part-information-input means of inputting symmetrical-part data for the drawing; a correlation means of correlating the drawing information that corresponds to the drawing created by the drawing-creation means, the accompanying information that is related to the drawing input by the accompanying-information-input means and the symmetrical-part information of the drawing input by the symmetrical-part-information-input means; and a memory means of storing the drawing information, accompanying information and symmetrical-part information that are correlated by the correlation means.

Also, the correlation means can give a specified number to the drawing information, give the number and first specified ID code to the accompanying data and give the number and second specified ID code to the symmetrical-part information.

The drawing-registration method of claim 3 comprises: a drawing-creation step of creating a drawing for a specified part; an accompanying-information-input step of inputting accompanying information that is related to the drawing; a symmetrical-part-information-input step of inputting symmetrical-part data for the drawing; a correlation step of correlating the drawing information that corresponds to the drawing created by the drawing-creation step, the accompanying information that is related to the drawing input by the accompanying-information-input step and the symmetrical-part information of the drawing input by the symmetrical-part-information-input step; and a memory step of storing the drawing information, accompanying information and symmetrical-part information that are correlated by the correlation step.

Also, in the correlation step, a specified number can be given to the drawing information, the number and first specified ID code can be given to the accompanying data and the number and second specified ID code can be given to the symmetrical-part information.

EFFECT OF THE INVENTION

As described above, with the drawing-registration system and drawing-registration method of this invention, a drawing of a specified part is created, accompanying information related to the drawing is input, symmetrical-part information for the drawing is input; then the drawing information corresponding to the created drawing, accompanying data related to the input drawing and symmetrical-part information for the input drawing are correlated, and the correlated drawing information, accompanying information and symmetrical-part information are stored in memory, so it is possible to register a drawing and accompanying information quickly and cheaply.

DESCRIPTION OF THE PREFERRED EMBODIMENTS

Figure 1:
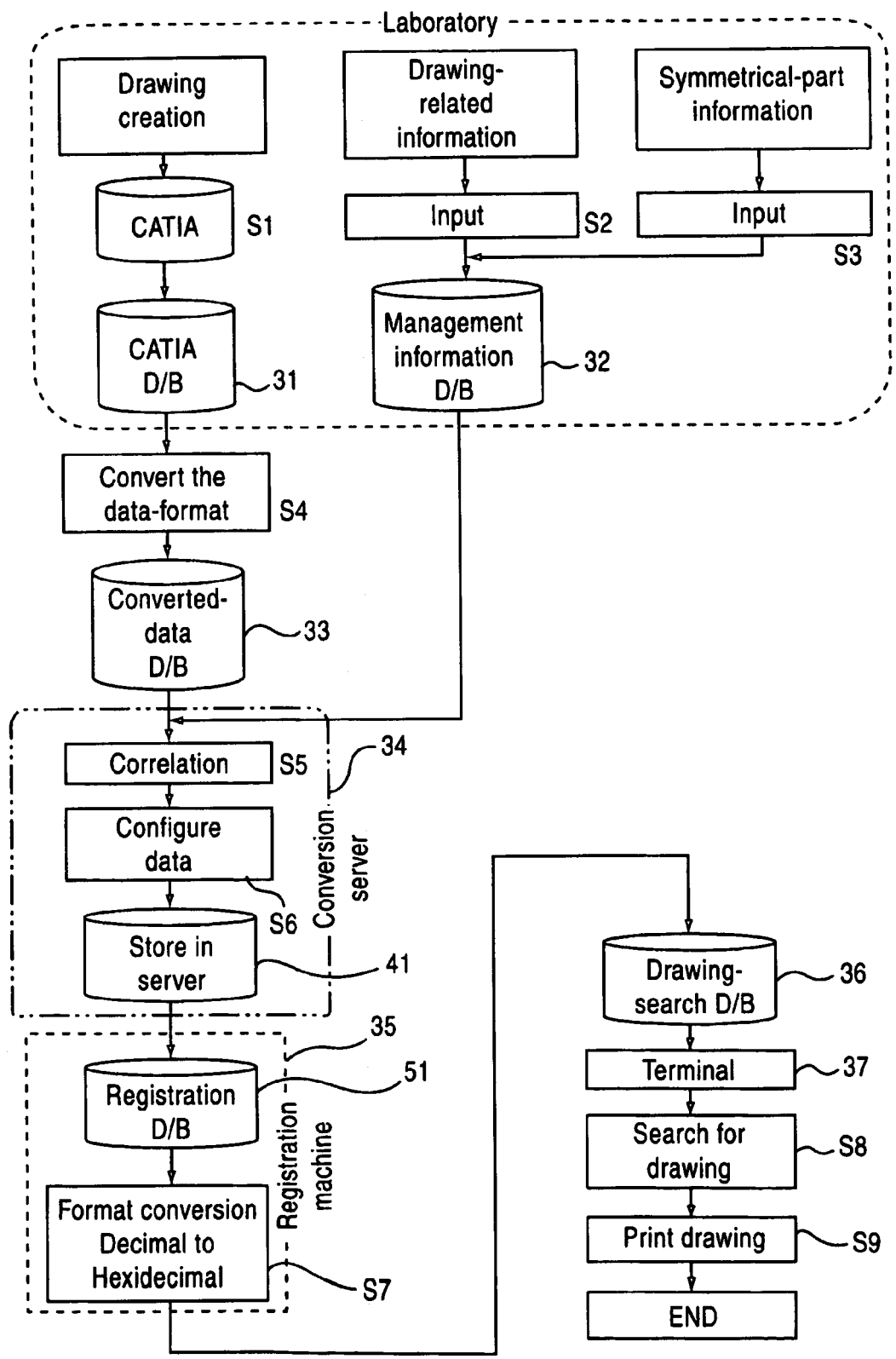
FIG. 1 is a drawing of the job flow showing the construction and operation of an embodiment of the drawing-registration system of this invention.
Figure 2:
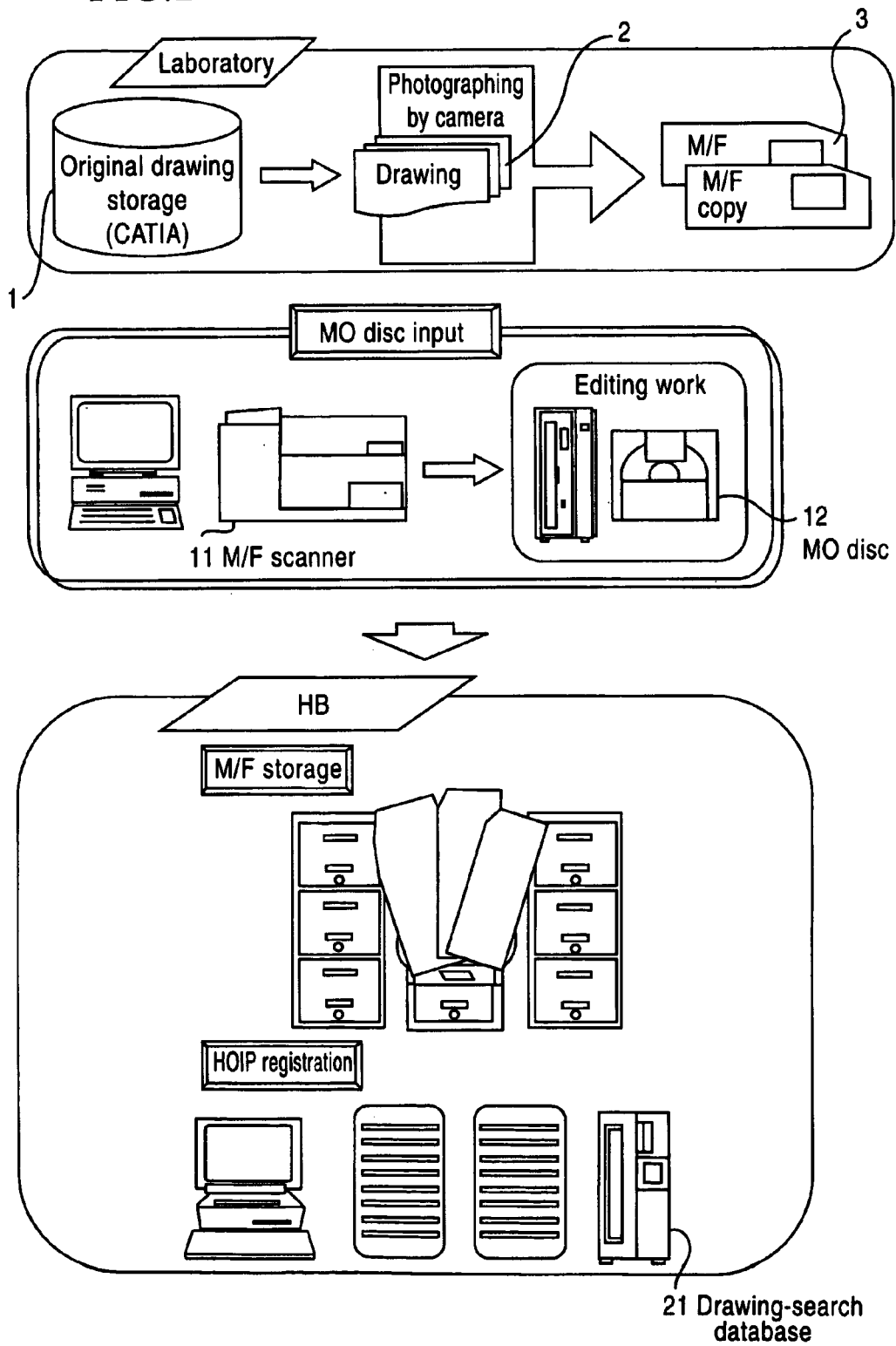
FIG. 2 is a drawing for explaining a prior drawing registration procedure.

The construction and the operation of an embodiment of the drawing-registration system of this invention will be explained below. FIG. 1 is a drawing of the job flow showing an example of the construction and the operation of this embodiment.

As shown in this same figure, this embodiment comprises: a CATIA database (D/B) 31 that stores drawing data created using CATIA (drawing creation system) on a workstation (computer) (not shown in the figure) that is set up in a laboratory; a management-information database (D/B) 32 that stores drawing-related information related to the drawing data, and symmetrical-part information; a data-conversion database (D/B) 33 that stores data whose data format has been converted; a memory apparatus 41 located in a conversion server 34; a registration database (D/B) 51 that is located in a registration machine 35; a drawing-search database (D/B) 36; and a terminal 37.

The database is created inside the memory apparatus of a personal computer or server (not shown in the figure) and connected over a network such that data can be sent and received.

Next, the processing procedure of the embodiment will be explained with reference to FIG. 1. First, in step S1, the user in the laboratory creates a drawing (parent drawing) of the specified part using CATIA. The data of the created drawing (drawing data) is supplied to the CATIA database 31 and stored. Also, in step S2, the user operates the keyboard or the like of the personal computer (not shown in the figure) to enter drawing-related information that is related to the drawing that was created in step S1, and stores it in the management-information database 32. Moreover, in step S3, the user operates the keyboard or mouse and enters symmetrical-part information corresponding to the drawing, and stores it in the management-information database 32.

The drawing-related information, is an operation that is to be performed for the part, for example, it is accompanying information such as the plating method. The symmetrical-part information is information that shows the part for which drawing data has been created and a part that has left-right symmetry.

ID information is given to the respective information. ID information (for example, drawing number) is given to the parent drawing for identifying the part when making it. As will be described below, a specified reference code is added to the ID information that is given to the parent drawing and given to the drawing-related information, and a specified reference code that is different than that of the drawing-related information is added to the ID information of the parent drawing as ID information. For example, the ID information '123456-ABC-abc' is given to the drawing data of the parent drawing.

In step S4, a data-format-conversion process is performed on the drawing data stored in the CATIA database 31, and the drawing data after data-format conversion is supplied to the converted-data database 33 and stored. Next, in step S5, the conversion server 34 reads the drawing data of a specified part from the converted-data database 33, and reads the drawing-related information and symmetrical-part information from the management-information database 32, and correlates these data.

For example, when the ID information '123456-ABC-abc' is given to the drawing data of the parent drawing (right drawing), the ID information '123456-ABC-abcI' is given to the drawing-related information corresponding to this parent drawing, for example. Here, 'I' is an ID code that indicates drawing-related information. The ID information '123456-ABC-abcL' is given to the symmetrical-part information corresponding to the parent drawing, for example. Here, 'L' is an ID code that indicates symmetrical-part information (left drawing). Since '123456-ABC-abc' is the part ID information for identifying the part, items of information having ID information that contains the same part ID information are related.

Next, in step S6, the data is configured and stored in the memory unit 41 of the conversion server 34. After that, the drawing data of the parent drawing, the drawing-related information and the symmetrical-part information are supplied to the registration database 51 located in the registration machine 35. Next, in step S7, the data format of the ID information for the drawing data, the ID information for the drawing-related information and the ID information for the symmetrical-part information that are registered in the registration database 51 are converted from decimal to hexadecimal information, and then the drawing data, drawing-related information, and symmetrical-part information are supplied to the drawing-search database 36 and stored.

In step S8, when there is an instruction by way of the terminal 37 to search for a drawing that corresponds to the ID information of a specified part, the drawing data of a part corresponding to that ID information, drawing-related information related to that drawing data and symmetrical-part information is obtained from the drawing-search database 36 as a search result. In step S9, the drawing data obtained in step S8 is printed.

As explained above, in this embodiment, the parent drawing, drawing-related information related to the parent drawing, the part corresponding to the parent drawing and the symmetrical-part information that shows a symmetrical part are related to each other and stored in the drawing-search database 36, so it is possible to efficiently manage left and right drawing data for a part and the accompanying data.

The construction and operation of the embodiment described above is an example, and needless to say, it is possible to make changes within a range that does not deviate from the scope or concept of the invention.

What is claimed is:

1. A drawing-registration system comprising:
    a drawing-creation means for creating a parent drawing for a specified part;
    a drawing creation system database storing said parent drawing, which was created by said drawing-creation means, storing parent drawing ID information for identifying said part, and correlating said parent drawing ID information and said parent drawing;
    an input means for inputting drawing-related information that is related to said parent drawing, which was created by said drawing-creation means;
    an input means for inputting symmetrical-part information that indicates said part that corresponds to said parent drawing and a part that has left-right symmetry;
    a management-information database storing said drawing-related information and said symmetrical-part information;
    a data-format-conversion means for converting data format of said parent drawing that is stored by said drawing creation system database;
    a converted-data database for storing said parent drawing whose data format has been converted by said data-format-conversion means, the converted-data database is separate from the drawing creation system database;

a correlation means for correlating said parent drawing, said drawing-related information and said symmetrical-part information by combining said parent drawing ID information of said parent drawing with a first specified ID code to form drawing-related ID information, and attaching this drawing-related ID information to said drawing-related information that corresponds to said part; and by combining said parent drawing ID information of said parent drawing that corresponds to said part with a second specified ID code to form symmetrical-part ID information, and attaching this symmetrical-part ID information to said symmetrical-part information that corresponds to said parent drawing;

a drawing-search database for converting data format of said parent drawing, said drawing-related information and said symmetrical-part information from decimal to hexadecimal information and storing, the drawing-search database is separate from the drawing creation system database and the converted-data database;

a search means for searching said parent drawing of said part that corresponds to said parent drawing ID information, said drawing-related information that is correlated with said parent drawing, and said symmetrical-part information that is correlated with said parent drawing from said drawing-search database, when there is an instruction by way of a specified terminal to search for a drawing that corresponds to the parent drawing ID information of a specified part; and a printing means for printing the search results of said search means.

* * * * *